(12) United States Patent
Yang et al.

(10) Patent No.: US 10,260,708 B2
(45) Date of Patent: Apr. 16, 2019

(54) DIRECT EMITTING LED ILLUMINATION MODULE FOR ELIMINATING CHROMATIC DISPERSION

(71) Applicants: EXCELLENCE OPTOELECTRONICS INC., Miaoli County (TW); EXCELLENCE OPTOELECTRONICS (DONG GUAN) LTD., Dongguan (CN)

(72) Inventors: Sheng-Hua Yang, Miaoli County (TW); Tai-Ku Lai, Miaoli County (TW); Pin-Chu Chen, Miaoli County (TW); Yi-Jing Huo, Miaoli County (TW)

(73) Assignees: Excellence Optoelectronics Inc., Hsinchu Science Park (TW); Excellence Optoelectronics (Dong Guan) Ltd., Dongguan (CN)

( * ) Notice: Subject to any disclaimer, the term of this patent is extended or adjusted under 35 U.S.C. 154(b) by 0 days.

(21) Appl. No.: 15/788,003

(22) Filed: Oct. 19, 2017

(65) Prior Publication Data

US 2018/0187863 A1 Jul. 5, 2018

(30) Foreign Application Priority Data

Dec. 30, 2016 (TW) .............................. 105220059 U

(51) Int. Cl.
*F21V 5/00* (2018.01)
*F21V 5/04* (2006.01)
(Continued)

(52) U.S. Cl.
CPC ............ *F21V 5/048* (2013.01); *F21S 41/141* (2018.01); *F21S 41/143* (2018.01);
(Continued)

(58) Field of Classification Search
CPC .......... F21V 5/048; F21V 5/002; F21V 5/045; H01L 33/58; G02B 19/0014;
(Continued)

(56) References Cited

U.S. PATENT DOCUMENTS

| 4,562,519 A | 12/1985 | Deves |
| 2008/0142822 A1* | 6/2008 | Kim ....................... H01L 33/54 257/98 |
| 2013/0021812 A1 | 1/2013 | Schug et al. |

FOREIGN PATENT DOCUMENTS

| CN | 103672733 A | 3/2014 |
| CN | 204611663 U | 9/2015 |

(Continued)

OTHER PUBLICATIONS

Correspondence From a Foreign Patent Office (Examination Report) in a Corresponding Patent Application.

*Primary Examiner* — Thomas M Sember
(74) *Attorney, Agent, or Firm* — Rosenberg, Klein & Lee

(57) ABSTRACT

A direct emitting LED illumination module for eliminating chromatic dispersion improves a vehicular LED lamp to comply with related regulations. The LED illumination module includes a LED light source and a plano-convex lens. The LED light source is located at the focus of the plano-convex lens. The LED light source emits light to the plane of the plano-convex lens, and the light exits from the convex surface of the plano-convex lens. The plano-convex lens focuses the light to form a desirable light pattern. Besides, the plane of the plano-convex lens has a microstructure thereon to suppress the angular correlated color temperature deviation of the light pattern and eliminate chromatic dispersion.

11 Claims, 3 Drawing Sheets

(51) Int. Cl.

| | |
|---|---|
| *F21S 41/20* | (2018.01) |
| *G02B 19/00* | (2006.01) |
| *H01L 33/58* | (2010.01) |
| *F21S 41/141* | (2018.01) |
| *F21S 41/143* | (2018.01) |
| *F21S 41/255* | (2018.01) |
| *F21S 41/275* | (2018.01) |
| *F21Y 115/10* | (2016.01) |
| *F21W 102/20* | (2018.01) |

(52) U.S. Cl.
CPC ........... *F21S 41/255* (2018.01); *F21S 41/275* (2018.01); *F21S 41/285* (2018.01); *F21V 5/002* (2013.01); *F21V 5/045* (2013.01); *G02B 19/0014* (2013.01); *G02B 19/0061* (2013.01); *H01L 33/58* (2013.01); *F21W 2102/20* (2018.01); *F21Y 2115/10* (2016.08)

(58) Field of Classification Search
CPC .. G02B 19/0061; F21S 41/143; F21S 41/255; F21S 41/275; F21S 41/141; F21S 41/285
See application file for complete search history.

(56) References Cited

FOREIGN PATENT DOCUMENTS

| | | |
|---|---|---|
| CN | 103363418 B | 1/2016 |
| GB | 1289776 | 9/1972 |
| JP | 201515264 A | 1/2015 |
| JP | 201599737 A | 5/2015 |
| TW | I443393 B | 7/2014 |
| TW | 201506299 A | 2/2015 |

\* cited by examiner

DIRECT EMITTING LED ILLUMINATION MODULE FOR ELIMINATING CHROMATIC DISPERSION

This application claims priority for Taiwan patent application no. 105220059 filed on Dec. 30, 2016, the content of which is incorporated by reference in its entirety.

BACKGROUND OF THE INVENTION

Field of the Invention

The present invention relates to an illumination module, particularly to a direct emitting LED illumination module that can be applied to vehicles and used to eliminate chromatic dispersion.

Description of the Related Art

LEDs are semiconductor devices. Compared with the conventional light source, LEDs have advantages of small volumes, high efficiency, long life, and difficultly-damaged properties. While a forward voltage is applied, the LED can emit discontinuous spectrum lights. Also, LEDs can generate light sources with different colors by changing components of phosphor. However, due to low luminous flux and low heat-resisting properties, LEDs cause difficulty in being applied to a vehicular lamp.

In recent years, with the improvement of fabrication processes and technology, the luminous flux and heat-resisting properties of LEDs are greatly improved. Due to small volumes and high brightness, LEDs are considerably used for designing a vehicular lamp in a limited space. Thus, there is a trend that LEDs are fabricated as a vehicular headlamp. However, the conventional vehicular lamp is designed with a hyperbolic reflector or a paraboloidal mirror. In the two architectures, LEDs difficultly produce their advantages, such as small and concentrated lighting areas, high light directivity, and properties of separating heat from light. As a result, LED light sources are not used for the conventional headlamp.

Since LED light sources use phosphor, the LED light sources have angular correlated color temperature deviation (ACCTD). If the LED light sources are applied to an optical system that has refractive elements (for example, lenses), the chromatic dispersion will cause the light pattern to have more serious angular correlated color temperature deviation (ACCTD). As a result, how to eliminate the chromatic dispersion under a certain level of light intensity is the hardest problem when LEDs are applied to a vehicular lamp.

In China patent No. 204611663, two lenses of different refractive indexes are used to form a single lens. Owing to the difference between the refractive indexes, the small optical path difference between different wavelengths can eliminate the chromatic aberration of a vehicular LED lamp. However, the difficulty and the cost of coupling the lenses made of different materials are both high. In addition, the choice of materials is limited. Thus, the technology of coupling the lenses made of different materials has very limited applicability. In China patent No. 103672733, sands and mists are sprayed on a specific region to eliminate the chromatic dispersion. However, this behavior can greatly reduce the transmittance of light and seriously influence the optical efficiency.

Therefore, how to eliminate the angular correlated color temperature deviation under a certain level of light intensity is a problem to be solved when LEDs are applied to a vehicular lamp.

SUMMARY OF THE INVENTION

To overcome the abovementioned problems, a primary objective of the present invention is to provide a direct emitting LED illumination module for eliminating chromatic dispersion, which uses a microstructure to suppress the angular correlated color temperature deviation of a light pattern, thereby eliminating chromatic dispersion. Thus, the LED illumination module complies with related regulations and is used for various vehicles. Besides, the low fabrication cost of the LED illumination module favors mass production and improves the market competitiveness of products.

To achieve the abovementioned objectives, the present invention provides a direct emitting LED illumination module for eliminating chromatic dispersion, which comprises a LED light source and a plano-convex lens. The LED light source is located at the focus of the plano-convex lens. The plano-convex lens is used to adjust a light pattern that is required. The plano-convex lens has a convex surface and a plane. The LED light source is located at a side of the plane. The LED light source emits light to the plane, and the light exits from the convex surface. The plane has a microstructure thereon, and the size of each dimension of the microstructure is 0.8-4.0 mm. The microstructure is distributed on a region having an inclined angle of larger than 15 degrees relative to the optic axis of the LED light source and used to suppress the angular correlated color temperature deviation (ACCTD) produced by the lens, thereby eliminating chromatic dispersion.

In an embodiment of the present invention, the area of the region that the microstructure is distributed is less than or equal to 40% of the area of the plane of the plano-convex lens. The microstructure comprises a plurality of pillars extended along the plane and protruded outwardly from the plane of the plano-convex lens. For example, the cross section of the pillar has a shape of an arc or a triangle. The abovementioned dimension is the width or the height of each of the plurality of pillars. In this way, the present invention effectively achieves the purpose of eliminating chromatic dispersion.

Below, the embodiments are described in detail in cooperation with the drawings to make easily understood the technical contents, characteristics and accomplishments of the present invention.

DETAILED DESCRIPTION OF THE INVENTION

In order to clearly disclose technical features of the direct emitting LED illumination module for eliminating chromatic dispersion of the present invention, several embodiments are introduced as below in cooperation with figures to obviously detail the technical features of the present invention.

Figure 1:
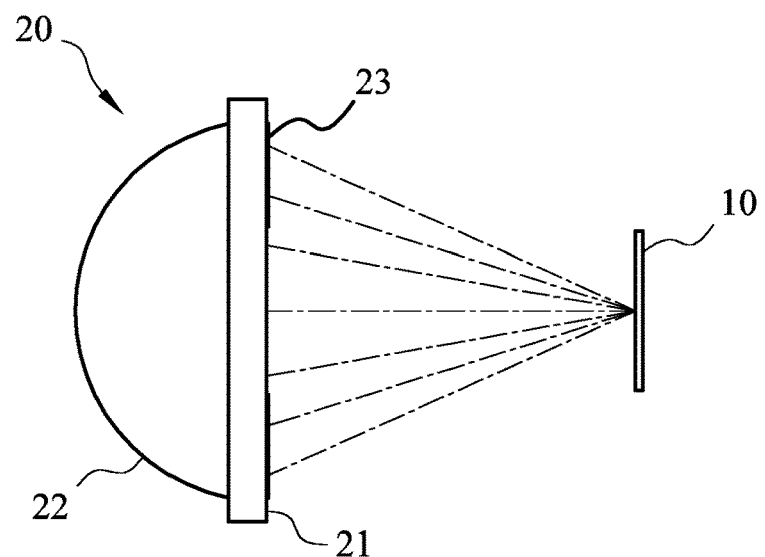
FIG. 1 is a diagram schematically showing a direct emitting LED illumination module for eliminating chromatic dispersion according to the first embodiment of the present invention.

Refer to FIG. 1. FIG. 1 is a diagram schematically showing the direct emitting LED illumination module for eliminating chromatic dispersion according to the first embodiment of the present invention.

As shown in FIG. 1, the direct emitting LED illumination module for eliminating chromatic dispersion comprises a LED light source 10 and a plano-convex lens 20. The LED light source comprises at least one LED chip. The LED light source 10 is located at the focus of the plano-convex lens 20. The plano-convex lens 20 has a plane 21 and a convex surface 22. The LED light source 10 is located at a side of the plane 21. The LED light source emits light to the plane 21, and then the light exits from the convex surface 22.

Figure 2:
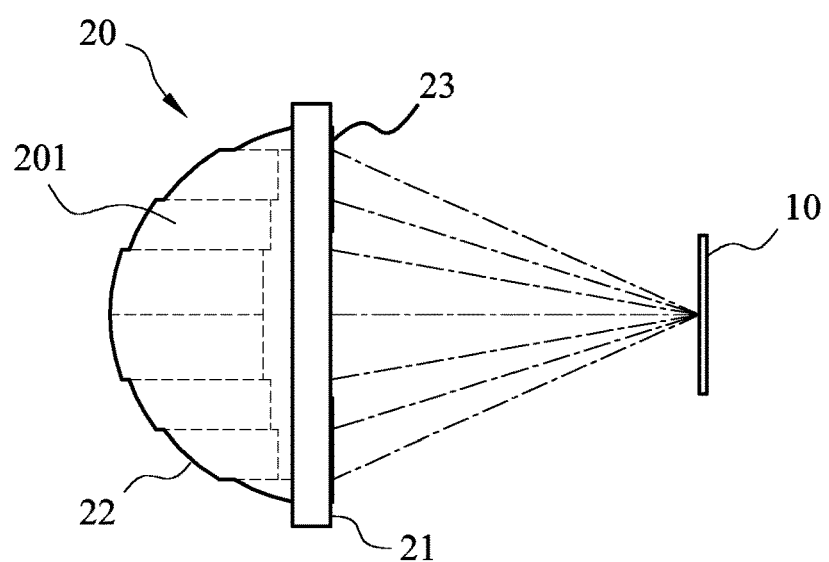
FIG. 2 is a diagram schematically showing a direct emitting LED illumination module for eliminating chromatic dispersion according to the second embodiment of the present invention.

According to the type of the convex surface 22 of the plano-convex lens 20, a desirable light pattern is formed. The light pattern varies according to a product that is required. Taking a vehicular headlamp as example. The minimum light intensity of the regions away from the central areas must conform to requirements of regulations. Thus, a multi focusing lens is used to modulate a light pattern in a large-angle region. Refer to FIG. 2. FIG. 2 is a diagram schematically showing the direct emitting LED illumination module for eliminating chromatic dispersion according to the second embodiment of the present invention. The plano-convex lens 20 consists of a plurality of confocal lenses 201 horizontally combined with each other. The plurality of confocal lenses 201 have a common focus. The LED light source 10 is located at the common focus. The types and curvatures of the lenses 201 depend on a light source and a light pattern that are required. The curvature of each lens 201 may be asymmetric in a perpendicular direction. As shown in the figure, four groups of lenses 201 are combined with each other, but the present invention is not limited thereto. The number of groups, curvatures, symmetry, and types of the lenses 201 vary according to a light source and a light pattern that are required.

The regulations ECE R112 Class B for vehicular headlamps have the brightness specifications of various positions of a vehicular lamp. Table 1 shows the comparison of the brightness specifications to simulation values obtained from the embodiment of FIG. 2.

TABLE 1

| Position of sample point | Angular coordinates | Light intensity (cd) | Specification requirement (cd) |
| --- | --- | --- | --- |
| Imax | | 65,300 | 40,500 |
| H-V | 0.0, 0.0 | 63,700 | 0.8 Imax (52,240) |
| H-5L | 0.0, 5L | 8,100 | 5,100 |
| H-2.5L | 0.0, 2.5L | 41,100 | 20,300 |

TABLE 1-continued

| Position of sample point | Angular coordinates | Light intensity (cd) | Specification requirement (cd) |
| --- | --- | --- | --- |
| H-2.5R | 0.0, 2.5 R | 41,600 | 20,300 |
| H-5R | 0.0, 5 R | 8,300 | 5,100 |

As a result, the light intensity of the simulation values complies with the specifications of the related regulations.

The wavelengths and the optical path difference of a LED light source cause the chromatic dispersion. Taking white light as example. White light is generated by using blue light emitted by a blue light chip to stimulate phosphor for yellow light. Thus, the spectrum of white light mainly includes blue light of a short wavelength and yellow light of a long wavelength. The refractive indexes of blue light and yellow light are different in a lens. In polycarbonates (PC) material, the refractive indexes of yellow light and blue light are respectively 1.589 and 1.608. As a result, the refractive capability of yellow light is weaker than that of blue light. The physical phenomena result in different light patterns that are formed at 25 meters such that the chromatic dispersion occurs. Accordingly, the hue distribution of light patterns for a vehicular lamp is spatially non-uniform.

With respect to the central region of a lens, yellow light and blue light have small incident angles. Besides, collimating light is emitted in the middle region of the light pattern. Thus, the hue distribution of the central region has uniform white light. However, an angle difference between yellow light and blue light that exit from the lens is larger. Thus, the serious chromatic dispersion apparently occurs at top and bottom sides of the edge of the light pattern, especially in the region having an inclined angle of larger than 15 degrees relative to the optic axis of a lighting surface of the LED light source.

Figure 3A:
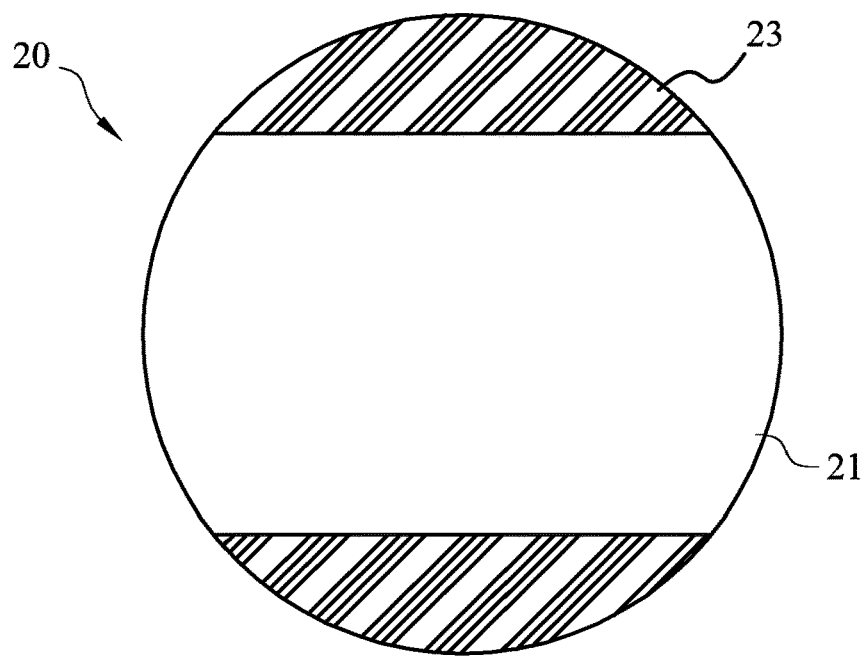
FIG. 3A and FIG. 3B are diagrams schematically showing a range that the microstructure of a direct emitting LED illumination module for eliminating chromatic dispersion is distributed according to an embodiment of the present invention.
Figure 3B:
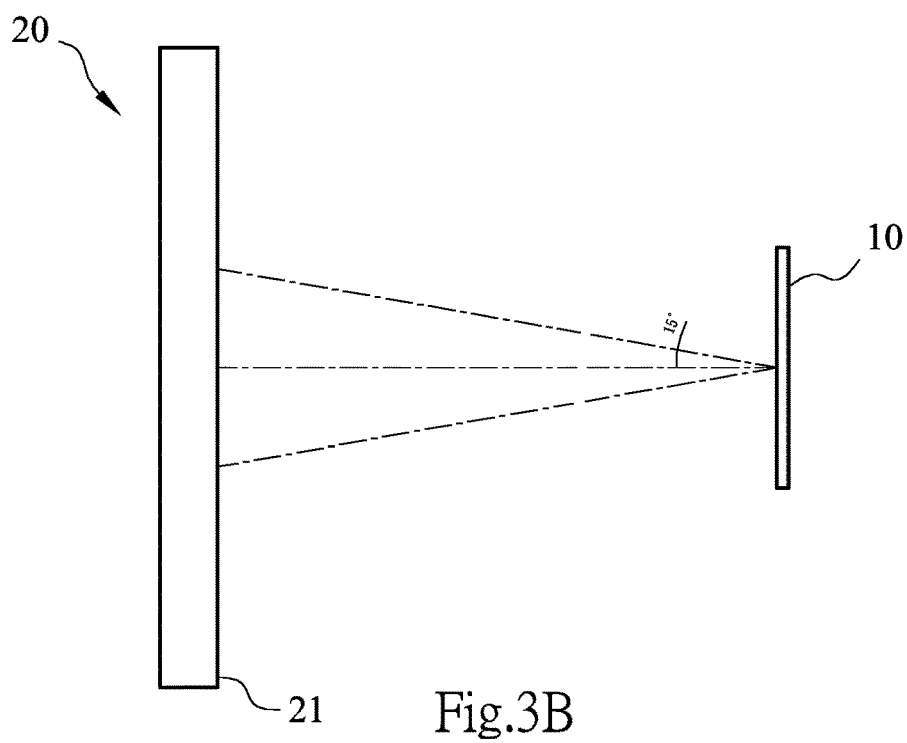

Refer to FIG. 3A and FIG. 3B. FIG. 3A and FIG. 3B are diagrams schematically showing a range that the microstructure of the direct emitting LED illumination module for eliminating chromatic dispersion is distributed according to an embodiment of the present invention.

As mentioned above, the present invention forms the microstructure 23 on the plane 21 to reduce the difficulty of forming the microstructure 23. The microstructure 23 is used to eliminate chromatic dispersion. Thus, the microstructure 23 is distributed on a region having an inclined angle of larger than 15 degrees relative to the optic axis of the LED light source 10, namely a region that chromatic dispersion apparently occurs. Preferably, the size of each dimension of the microstructure 23 is 0.8-4.0 mm to eliminate chromatic dispersion. Besides, the microstructure 23 can reduce the transmittance of light to influence the light intensity of a lamp. As a result, the area of the region that the microstructure 23 is preferably distributed is less than or equal to 40% of the area of the plane 21 of the plano-convex lens 20.

Figure 4:
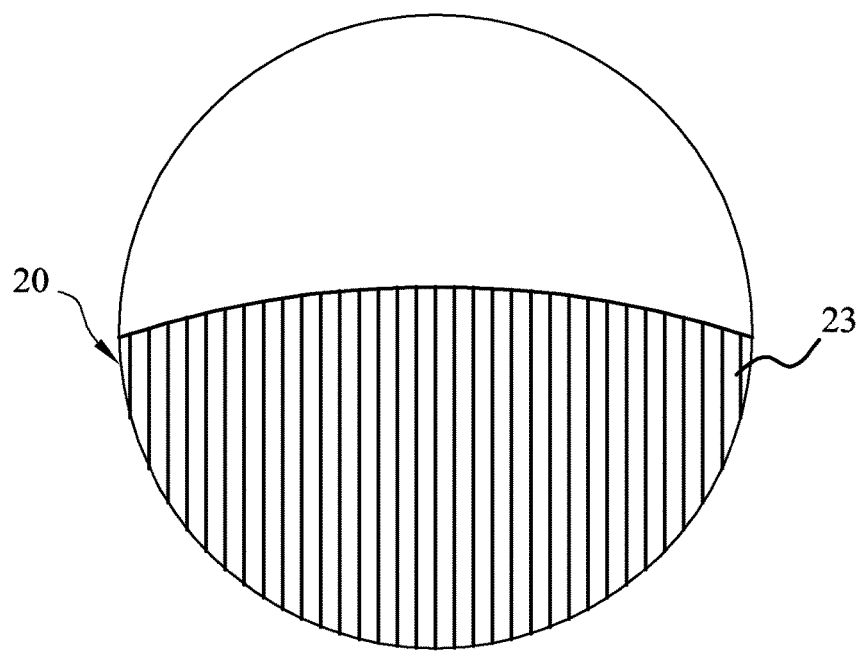
FIG. 4 is a partial enlarged diagram schematically showing the microstructure of a direct emitting LED illumination module for eliminating chromatic dispersion according to an embodiment of the present invention.
Figure 5A:
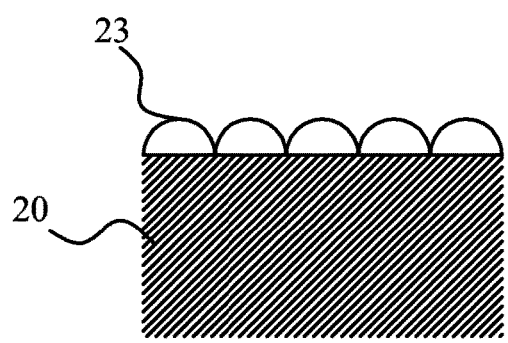
FIG. 5A and FIG. 5B are cross-sectional diagrams showing the microstructure of a direct emitting LED illumination module for eliminating chromatic dispersion according to an embodiment of the present invention.
Figure 5B:
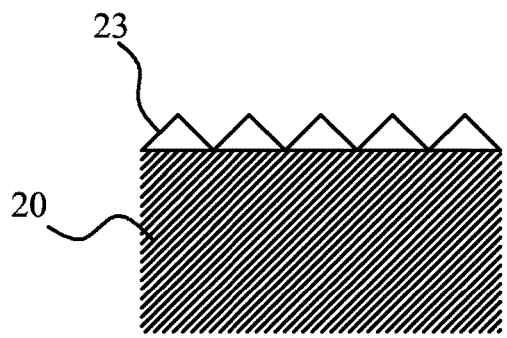

Refer to FIG. 4. The microstructure 23 comprises a plurality of pillars protruded outwardly from the plane of the plano-convex lens 20. Thus, the dimension of the microstructure 23 is the width or the height of each of the plurality of pillars. On the other side, the cross section of the pillar has a shape of an arc or a triangular. As shown in FIG. 5A, when the cross section of the pillar has a shape of an arc, the height and the width of the arc are 0.8-4.0 mm. As shown in FIG. 5B, when the cross section of the pillar has a shape of a triangular, the height and the width of the triangular are 0.8-4.0 mm. Hence, the chromatic dispersion can be effectively eliminated.

According to the embodiment of FIG. 2, the microstructure 23 is distributed at the top and bottom sides of the plane 21 of the plano-convex lens 20. In addition, the microstructure 23 is horizontally distributed in up and down directions. Take the microstructure 23 having a cross-sectional shape of a semi-circle as example. The related simulation values of the microstructure 23 are shown in Table 2.

TABLE 2

| Position of sample point | Light intensity (cd) | Light intensity (microstructure added) (cd) | Maintaining rate of light intensity |
|---|---|---|---|
| Imax | 65,300 | 49,400 | 76% |
| H-V | 63,700 | 47,700 | 75% |
| H-5L | 8,100 | 6,500 | 80% |
| H-2.5L | 41,100 | 29,500 | 72% |
| H-2.5R | 41,600 | 30,200 | 73% |
| H-5R | 8,300 | 6,600 | 80% |

As a result, after adding the microstructure 23, the simulation values still comply with regulations. Besides, a lamp formed by the microstructure 23 has optical loss of 5-8%. The rate that the simulation value of Imax closest to the specification value is higher than the standard specification is 38% of the standard specification. Thus, the maintaining rate of whole light intensity is more than 70% so that the lamp complies with related regulations.

The arrangement of the microstructure 23 is designed according to the embodiment of FIG. 2. According to the requirement of usage, the arranged region may be asymmetric. Certainly, the height and the width of each pillar may be different. The angle of arranging the pillars may be not horizontal. The figures are only to exemplify the present invention but not to limit the scope and application of the present invention. In conclusion, the direct emitting LED illumination module for eliminating chromatic dispersion of the present invention locates the microstructure on the plane of the plano-convex lens and locates the LED light source at the focus of the plano-convex lens, such that light is emitted to the plane and exits from the convex surface, thereby suppressing angular correlated color temperature deviation produced by the LED light source and eliminating chromatic dispersion. On top of that, the microstructure is located on the plane of the plano-convex lens to greatly reduce the difficulty of forming the microstructure and effectively reduce the cost. The convex surface varies according to the status of usage, so as to modulate a desirable light pattern. In addition to combining multiple lenses, various textures or patterns are alternatively formed on the convex surface. This way is not only used for vehicular light devices but also satisfies various illumination requirements, thereby improving additional values of products and creating new business opportunities.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A direct emitting LED illumination module for eliminating chromatic dispersion comprising:
   a LED light source emitting light; and
   a plano-convex lens having a convex surface and a plane and neighboring the LED light source, the LED light source is located at a focus of the plano-convex lens and located at an identical side of the convex surface and the plane, the light is emitted to the plane and exits from the convex surface, the plane has a microstructure thereon, a size of each dimension of the microstructure is 0.8-4.0 mm, and the microstructure is distributed on a region having an inclined angle of larger than 15 degrees relative to an optic axis of the LED light source.

2. The direct emitting LED illumination module for eliminating chromatic dispersion according to claim 1, wherein the LED light source comprises at least one LED chip.

3. The direct emitting LED illumination module for eliminating chromatic dispersion according to claim 1, wherein the plano-convex lens consists of a plurality of confocal lenses, and the LED light source is located at a common focus of the plurality of confocal lenses.

4. The direct emitting LED illumination module for eliminating chromatic dispersion according to claim 3, wherein the plurality of confocal lenses are horizontally combined with each other.

5. The direct emitting LED illumination module for eliminating chromatic dispersion according to claim 1, wherein an area of the region that the microstructure is distributed is less than or equal to 40% of an area of the plane of the plano-convex lens.

6. The direct emitting LED illumination module for eliminating chromatic dispersion according to claim 1, wherein the microstructure comprises a plurality of pillars protruded outwardly from the plane of the plano-convex lens.

7. The direct emitting LED illumination module for eliminating chromatic dispersion according to claim 6, wherein a cross section of the pillar has a shape of an arc.

8. The direct emitting LED illumination module for eliminating chromatic dispersion according to claim 6, wherein a cross section of the pillar has a shape of a triangle.

9. The direct emitting LED illumination module for eliminating chromatic dispersion according to claim 6, wherein the dimension of the microstructure is a width or a height of each of the plurality of pillars.

10. The direct emitting LED illumination module for eliminating chromatic dispersion according to claim 6, wherein the plurality of pillars of the microstructure are distributed at a top side and a bottom side of the plane of the plano-convex lens.

11. The direct emitting LED illumination module for eliminating chromatic dispersion according to claim 10, wherein the pillar is disposed in up and down directions, and an arranging direction of the microstructure is perpendicular to a disposing direction of the of the microstructure.

* * * * *